United States Patent
Imai

(10) Patent No.: US 8,134,151 B2
(45) Date of Patent: Mar. 13, 2012

(54) THIN FILM TRANSISTOR, ACTIVE MATRIX SUBSTRATE, AND IMAGE PICKUP DEVICE

(75) Inventor: Shinji Imai, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 167 days.

(21) Appl. No.: 12/538,890

(22) Filed: Aug. 11, 2009

(65) Prior Publication Data

US 2010/0044711 A1 Feb. 25, 2010

(30) Foreign Application Priority Data

Aug. 19, 2008 (JP) ................................. 2008-210934
May 26, 2009 (JP) ................................. 2009-126847

(51) Int. Cl.
*H01L 27/144* (2006.01)
(52) U.S. Cl. ....... 257/43; 257/59; 257/72; 257/E27.146; 257/E31.092
(58) Field of Classification Search ..................... 257/43, 257/E31.086, E31.092, 59, 72, E27.146; 250/370.09
See application file for complete search history.

(56) References Cited

U.S. PATENT DOCUMENTS 6,323,490 B1 * 11/2001 Ikeda et al. .............. 250/370.09
2001/0008271 A1   7/2001 Ikeda et al.
2004/0251421 A1  12/2004 Kobayashi et al.
2005/0275038 A1 * 12/2005 Shih et al. ..................... 257/382
2006/0102968 A1   5/2006 Bojarczuk, Jr. et al.
2009/0174012 A1 *  7/2009 Iwasaki ......................... 257/410

FOREIGN PATENT DOCUMENTS

JP   2006-165530   6/2006
WO     9622616    7/1996

OTHER PUBLICATIONS

"Nikkei Electronics," Nikkei Business Publications, p. 104, May 5, 2008.

* cited by examiner

*Primary Examiner* — Victor A Mandala
*Assistant Examiner* — Scott Stowe
(74) *Attorney, Agent, or Firm* — SOLARIS Intellectual Property Group, PLLC

(57) ABSTRACT

A thin film transistor including: source and drain electrodes, an active layer that contacts the source and drain electrodes and contains an oxide semiconductor, a gate electrode that controls current flowing between the source and drain electrodes via the active layer, a first insulating film that separates the gate electrode from the source and drain electrodes and the active layer, a bias electrode that is arranged at the opposite side of the active layer from the gate electrode, and has an electric potential fixed independently from the gate electrode, and a second insulating film that separates the bias electrode from the source and drain electrodes and the active layer.

5 Claims, 7 Drawing Sheets

THIN FILM TRANSISTOR, ACTIVE MATRIX SUBSTRATE, AND IMAGE PICKUP DEVICE

CROSS-REFERENCE TO RELATED APPLICATION

This application claims priority under 35 USC 119 from Japanese Patent Application No. 2008-210934 filed on Aug. 19, 2008 and Japanese Patent Application No. 2009-126847 filed on May 26, 2009, the disclosures of which are incorporated by reference herein.

BACKGROUND OF THE INVENTION

1. Field of the Invention

The present invention relates to a thin film transistor, an active matrix substrate, and an image pickup device.

2. Description of the Related Art

In recent years, the development of liquid crystal displays and organic EL (electroluminescence) displays has been advancing. These displays have drive systems classified into the passive matrix system or the active matrix system. In the active matrix system, a thin film transistor (TFT) is formed for every pixel to control the driving. Because of formation of the TFTs, the active matrix system has such an advantage that, although it has a complex structure, high image quality can easily be obtained, as compared with the passive matrix system.

Meanwhile, in wide fields including the medical, industrial and atomic energy fields, image pickup devices that take an image by irradiating electromagnetic waves such as X-rays are utilized. For example, the radiation image pickup device irradiates radiation to an object, detects the intensity of the radiation that has passed through the object, and thus obtains information about the inside of the object. These radiation image pickup devices are broadly classified into direct image pickup devices and indirect image pickup devices. The direct image pickup device employs a system of directly converting the radiation that has passed through the object into electric signals to be extracted to the outside, and the indirect image pickup device employs a system of causing the radiation that has passed through the object to be incident on a fluorescent material to convert it once into visible light, and converting the visible light into electric signals to be extracted to the outside.

In radiation image pickup devices for use as direct image pickup devices, generally, incident radiation (for example, X-rays) is directly converted into electric signals (charge) by an a-Se-based semiconductor film having sensitivity to the radiation. FIG. 6 schematically shows the basic constitution of a radiation sensor of a direct conversion type. The radiation sensor is provided with an active matrix substrate 100 having many collecting electrodes (not shown) formed thereon in a two dimensional matrix arrangement set in a radiation detection effective area SA and an electric circuit (not shown) for accumulating/reading out charges collected at respective collecting electrodes along with the incidence of the radiation, an a-Se-based semiconductor film 102 laminated on the collecting electrode-formed face side of the active matrix substrate 100, and a common electrode 104 for applying bias voltage laminated broadly in a planar shape on the front side of the a-Se-based semiconductor film 102.

To the common electrode 104, bias voltage is applied from a bias supply power source, and, in a state in which the bias voltage is applied, charges that are generated at the a-Se-based semiconductor film 102 along with the incidence of radiation to be detected and are collected at the respective collecting electrodes are extracted as a radiation detection signal for each of the collecting electrodes by the accumulating/reading out electric circuit composed of a capacitor, a switching element, electric wiring and the like.

For example, in order to construct a non-planar X-ray image pickup device, it has been proposed to use a flexible substrate, arrange three TFTs in one pixel, and form an active layer with an In—Ga—Zn—O-based amorphous oxide (see JP-A No. 2006-165530). It is described that the formation of the active layer with an In—Ga—Zn—O-based amorphous oxide leads to a carrier concentration of less than $10^{18}/cm^3$ to attain a normally-off operation.

In addition, as a TFT for use in organic EL displays of the active matrix system, a TFT having a so-called double-gate structure, in which an active layer is formed with an In—Ga—Zn—O-based amorphous oxide and a gate electrode is arranged on both sides of the active layer, is disclosed (see "Nikkei Electronics," Nikkei Business Publications, p 104, May 5, 2008). It is reported that, by forming an IGZO-based TFT into a double-gate structure and controlling both gate electrodes with the same voltage, an apparent electron field-effect mobility increases significantly as compared with a case of one gate electrode, and that, when the gate voltage is 0 V, off current decreases as compared with general double-gate structure TFTs.

When an amorphous oxide semiconductor is used as an active layer of TFTs, although there is such an advantage as high in-plane uniformity of threshold voltages, it is difficult to assure drive stability of the threshold value. When it is attempted to suppress the variation of the threshold value due to the driving, the carrier concentration in the active layer becomes comparatively high, and the TFT is apt to exhibit a normally-on operation. The normally-on operation causes such a problem as the necessity for an additional power source.

It is practically necessary for the normally-off operation that the carrier concentration of the active layer is less than $10^{16}$ cm$^{-3}$. In this case, however, there is such problem that the threshold value is apt to vary.

Further, there is also such a problem that an insulator exists on the back-channel side of a TFT, and that electrification by static charge changes the threshold value of the TFT. When used, particularly, as a direct conversion type X-ray image pickup device, charges generated by X-rays are apt to electrify the back-channel to easily vary the threshold value.

On the other hand, when arranging two gate electrodes based on the double-gate structure and controlling them by the same electric potential, it is necessary to provide a contact hole in the interlayer insulating film and to connect electrically the two gate electrodes. This makes the manufacturing process complex and thus raises the manufacturing cost significantly. Further, in the case of a double-gate structure in which two gate electrodes are controlled by the same electric potential, there is such a problem that power consumption increases as compared with the case of the single-gate structure.

SUMMARY OF THE INVENTION

According to an aspect of the invention, there is provided a thin film transistor comprising:
source and drain electrodes,
an active layer that contacts the source and drain electrodes and contains an oxide semiconductor,
a gate electrode that controls current flowing between the source and drain electrodes via the active layer, a first insulating film that separates the gate electrode from the source and drain electrodes and the active layer, a bias electrode that is arranged at the opposite side of the active layer from the gate electrode, and has an electric potential fixed independently from the gate electrode, and a second insulating film that separates the bias electrode from the source and drain electrodes and the active layer.

DETAILED DESCRIPTION OF THE INVENTION

Figure 1:
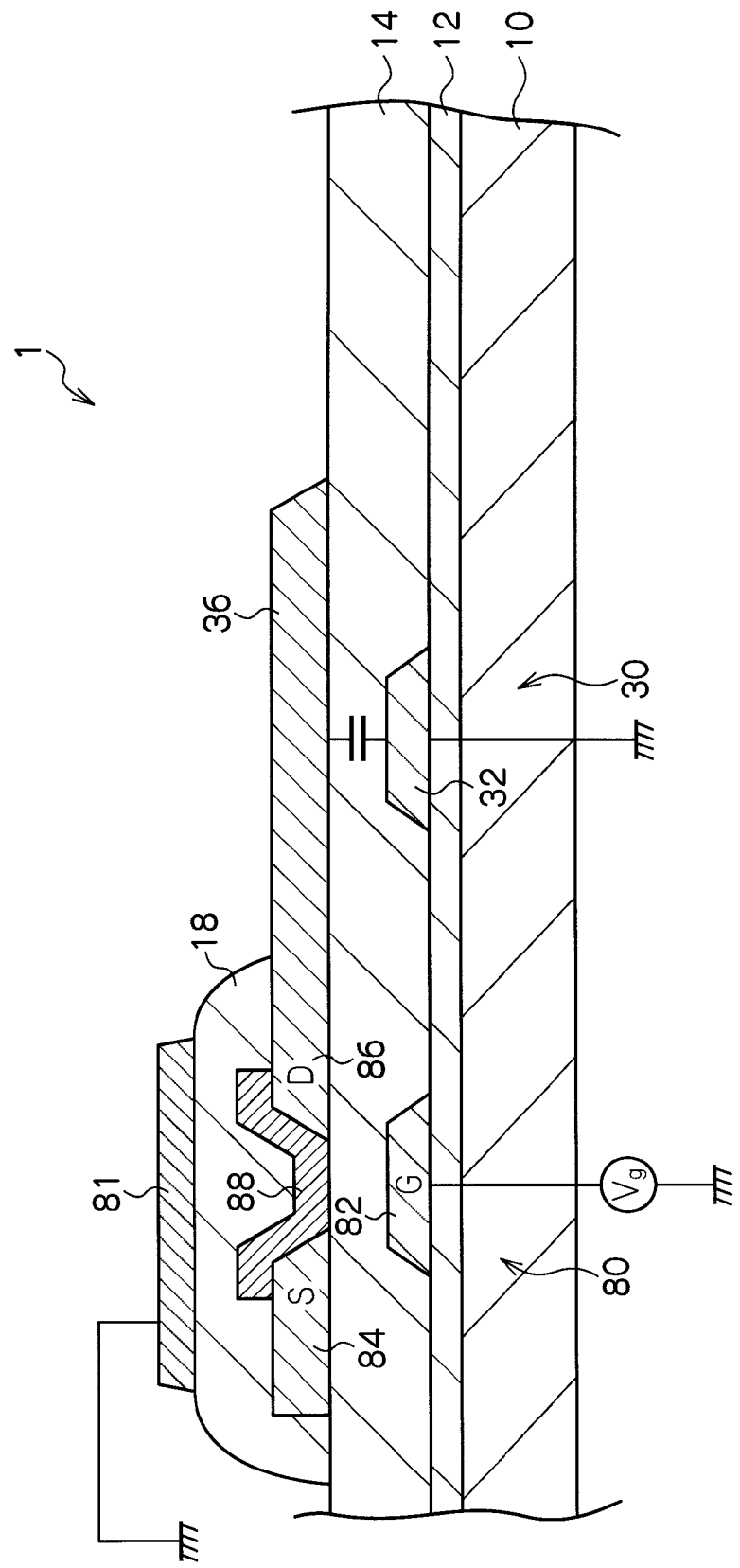
FIG. 1 is a cross-sectional view roughly showing the constitution corresponding to one pixel of the active matrix substrate according to a first embodiment.

Hereinafter, the thin film transistor, the active matrix substrate, and the image pickup device according to the present invention are specifically described, while referring to attached drawings. In the drawings, to members (constitutional components) having the same or corresponding function, the same symbols are given and the description is omitted appropriately. The material, film-forming method, film thickness and the like of respective members mean an example, and they may be appropriately selected corresponding to the purpose of a thin film transistor, an active matrix substrate, or an image pickup device, electromagnetic wave to be detected, and the like.

First Embodiment

FIG. 1 roughly shows one example of the constitution of the active matrix substrate provided with the thin film transistor (TFT) according to a first embodiment. An active matrix substrate 1 according to the embodiment is used for manufacturing X-ray sensors, organic EL displays and the like, and, on the support substrate 10, one TFT 80 and one capacitor 30, respectively, are provided in every region in which one pixel is formed.

The TFT 80 has a source electrode 84 and a drain electrode 86 that are opposed to each other (appropriately referred to as "source and drain electrodes"), an active layer 88 that contacts with source and drain electrodes 84 and 86 and contains an oxide semiconductor, a gate electrode 82 that controls current flowing between source and drain electrodes 84 and 86 via the active layer 88, a first insulating film 14 that separates the gate electrode 82 from source and drain electrodes 84 and 86 and the active layer 88, a bias electrode 81 that is arranged at the opposite side (back-channel side) of the active layer 88 from the gate electrode 82, whose electric potential is fixed independently from the gate electrode 82, and a second insulating film 18 that separates the bias electrode 81 from source and drain electrodes 84 and 86 and the active layer 88.

On the other hand, the capacitor 30 is constituted from a lower electrode 32, the first interlayer insulating film 14, and an upper electrode 36. The drain electrode 86 of the TFT 80 is electrically connected with the upper electrode 36 of the capacitor 30.

And, even in the case of a device that has a relatively high carrier concentration in the active layer 88 and, usually, is apt to be in a normally-on operation, in the above-described TFT 80, application of a constant bias electric potential (for example, earth electric potential) to the bias electrode 81 during the operation of the TFT 80 enables a stable normally-off operation and a TFT with a small shift of the threshold value.

Hereinafter, respective constitutional components and the manufacturing methods thereof are specifically described.

<Support Substrate>

As the support substrate 10, one having a strength capable of supporting other constitutional components (image pickup device or display device) than the support substrate 10 is used. For example, a glass substrate, a plastic substrate, a metal substrate, and the like may be used. Meanwhile, when manufacturing a flexible image pickup device or display, a plastic substrate or a metal substrate may be employed.

In the embodiment, the support substrate 10 of polyethylene naphthalate (PEN) is used, and a SiON film 12 is formed on the whole face of one side on which devices are formed. The SiON film 12 can be formed by a CVD method, and has a thickness of, for example, 500 nm.

<Lower Electrode of Capacitor and Gate Electrode of TFT>

On the SiON film 12, there are formed the lower electrode 32 of the capacitor 30 and the gate electrode 82 of the TFT 80. By photolithography, for example, a molybdenum (Mo) film is patterned at positions and in shapes corresponding to the respective electrodes 32 and 82. Or, a mask having apertures corresponding to the position and the shape of respective electrodes 32 and 82 is used to pattern the Mo film. The thickness of respective electrodes 32 and 82 is, for example, 40 nm.

Meanwhile, the gate electrode is preferably formed by a metal film having light shielding properties, in order to prevent malfunctions of the active layer 88 caused by light.

<First Interlayer Insulating Film>

On the gate electrode 82 of the TFT 80 and the lower electrode 32 of the capacitor 30, the first interlayer insulating film (gate insulating film) 14 is formed. The first interlayer insulating film 14 is formed, for example in a thickness of 500 nm using acrylic resin. The first interlayer insulating film 14 is formed, for example, by coating an acrylic resin with a known method such as a spin coating method, a spray coating method and a screen printing method, and optionally curing the resin by application of an external energy such as irradiation of ultraviolet rays or heating.

<Source and Drain Electrodes and Upper Electrode of Capacitor>

On the first interlayer insulating film 14, source and drain electrodes 84 and 86 of the TFT 80, and the upper electrode 36 of the capacitor 30 are formed. By photolithography, for example, an IZO ($In_2O_3$—ZnO) film is formed at positions and in shapes corresponding to source and drain electrodes 84 and 86 of the TFT 80, and the upper electrode 36 of the capacitor 30. On this occasion, the patterning is performed so as to connect electrically the drain electrode 86 of the TFT 80 with the upper electrode 36 of the capacitor 30. The thickness of respective electrodes 36, 84 and 86 is, for example, 200 nm.

<Active Layer>

Between source and drain electrodes 84 and 86, the active layer (channel layer) 88 is formed. The active layer 88 contains an oxide semiconductor, and is formed preferably by an In—Ga—Zn—O-based oxide semiconductor, and more preferably by an amorphous oxide semiconductor. As the In—Ga—Zn—O-based oxide semiconductor, oxides including at least one of In, Ga and Zn (for example, In—O-based one) are preferable, oxides including at least two of In, Ga and Zn (for example, In—Zn—O-based, In—Ga-based, and Ga—Zn—O-based ones) are more preferable, and oxides including In, Ga and Zn are particularly preferable. As the In—Ga—Zn—O-based amorphous oxide, amorphous oxides having a composition represented by $InGaO_3(ZnO)_m$ (m is a natural number of less than 6) in the crystalline state is preferable, and, in particular, $InGaZnO_4$ is more preferable. In these oxide semiconductors, a higher carrier concentration causes a higher electron mobility, that is, a greater electroconductivity causes a higher electron mobility.

When the carrier concentration in the active layer is relatively high, usually, TFT is apt to be in a normally-on operation. But, in the embodiment, even when the carrier concentration in the active layer 88 is $3 \times 10^{17}$ cm$^{-3}$ or more, it is possible to be in a normally-off operation and to suppress the shift of the threshold value to be small, by applying a constant bias electric potential to the bias electrode 81 during the operation of the TFT 80.

The active layer 88 composed of the In—Ga—Zn—O-based amorphous oxide semiconductor as described above can be formed into a film at low temperatures by sputtering. In accordance with the active layer 88 to be formed, the film of an In—Ga—Zn—O-based amorphous oxide semiconductor may be patterned by photolithography, or the active layer 88 may be formed at a prescribed position in a prescribed shape by use of a mask having a hole corresponding to the active layer 88 to be formed. The thickness of the active layer 88 is, for example, 10 nm.

<Second Interlayer Insulating Film>

On source and drain electrodes 84 and 86 and the active layer 88, a second interlayer insulating film 18 is formed. The second interlayer insulating film 18 can be formed at a prescribed position, for example, using an acrylic resin by photolithography. The thickness of the second interlayer insulating film 18 may be a thickness that makes the normally-off operation possible and suppresses the shift of the threshold value by fixing the electric potential of the bias electrode 81 formed thereon at a prescribed value. It is, for example, 500 nm.

Meanwhile, the formation of the second interlayer insulating film 18, for example, by a sintered acrylic resin could lead to the degradation of the oxide semiconductor due to the effect of contained moisture. And, when forming the insulating film 18 by coating a resin such as an acrylic resin, the formation of a thin insulating film 18 having a thickness of not more than 500 nm in a uniform thickness is difficult. Further, heating at a sintering temperature of around 220° C. is necessary, and, for example, the use of a resin substrate could lead to the degradation of the substrate.

Consequently, as the second interlayer insulating film 18, the use of an amorphous gallium oxide (a-$Ga_2O_3$) film formed by sputtering is preferable. The formation of a gallium oxide film as the second interlayer insulating film 18 by a sputtering method makes it possible to form a thin insulating film 18 having a thickness of not more than 500 nm at room temperature more uniformly than the case where an acrylic resin is used, without degrading the active layer composed of an oxide semiconductor thereunder. The formation of the second insulating film 18 in a thinner thickness of not more than 500 nm with more uniformity, as described above, can enhance the sensitivity (controllability) of the bias electrode 81. Further, also from the standpoint of barrier properties against oxygen and moisture, an gallium oxide film is advantageous in point of having high barrier properties as compared with films of resin such as acrylic resin.

Figure 8:
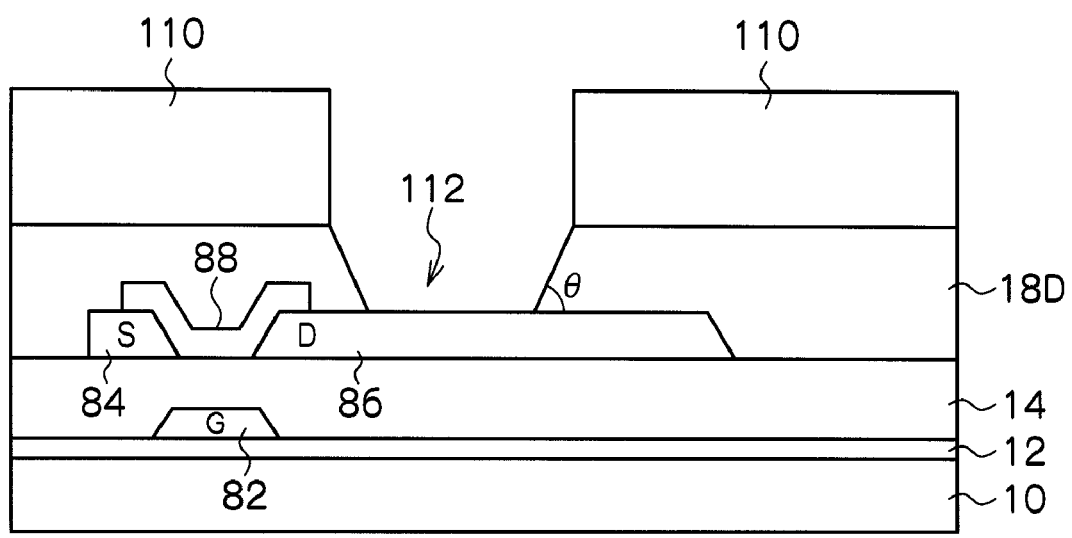
FIG. 8 is an outline view showing a tilt angle of an edge portion when forming a contact hole in a second interlayer insulating film of gallium oxide by etching.

When forming a gallium oxide film as the second interlayer insulating film, for example, a photoresist (resist patterns) 110 is formed by a photolithographic method on a gallium oxide film 18D formed by sputtering, and then patterning is performed by etching, as shown in FIG. 8. Here, in the etching of the gallium oxide film 18D, an alkaline solution can be used, and, as the alkaline solution, an alkaline developer used for developing the resist after exposure may also be used. Accordingly, for example, an alkaline developer can develop a resist film, and remove the gallium oxide film 18D exposed from the resist patterns 110. Further, an alkaline etchant, including alkaline developers, hardly generates a problem such as damages caused by the etching, even when source and drain electrodes 84 and 86 thereunder are made of a material such as an amorphous transparent electrode (such as IZO) having a low resistance against an acid. Furthermore, wet etching can be performed by inexpensive facilities as compared with dry etching, and is advantageous also in point of capability of reducing cost.

When patterning a gallium oxide film by alkali etching to form the second interlayer insulating film, it is easy to form the edge portion of the second interlayer insulating film into a tapered shape. For example, as shown in FIG. 8, when forming a contact hole 112 in the gallium oxide film 18D to be the second interlayer insulating film by alkali etching, it is possible to control the tilt angle θ of the edge portion (side wall of contact hole 112) of the gallium oxide film 18D according to an etching condition. Accordingly, the formation of the gallium oxide film 18D as the second interlayer insulating film is suitable for forming the contact hole 112, and also can effect the improvement of the reliability of electrode connection.

The etching of the gallium oxide film 18D can be adjusted, for example, by baking temperature conditions at the post baking of the resist pattern 110, temperature conditions of the developer (etching solution), concentration variation of the etching solution, and the like. By controlling these etching parameters, the tilt angle θ of the edge portion of the gallium oxide film 18D varies, and, therefore, the angle can be adjusted, for example, within the range of 30° to 80°.

Meanwhile, in order to control the tilt angle θ of the edge portion of the gallium oxide film 18D with a higher accuracy, after the development of the resist film, an alkali etchant for etching the gallium oxide film 18 may be used, independently from the developer.

<Bias Electrode>

On the second interlayer insulating film 18, the bias electrode 81 is formed. As the bias electrode 81, for example, an IZO film is formed on the second interlayer insulating film 18 by photolithography. The thickness of the bias electrode 81 is, for example, 50 nm.

The bias electrode 81 is connected with a power source (including GND) for giving a fixed electric potential. From the standpoint of attaining the normally-off operation and suppressing the shift of the threshold value to be small, the electric potential of the bias electrode 81 is preferably fixed at an electric potential within the range of −2 to +0.5 V, and particularly preferably at the earth electric potential (GND). When it is fixed at the earth electric potential, power consumption can be suppressed to be smaller, and the electric potential of the bias electrode 81 is easily and surely fixed, and, even when the carrier concentration of the active layer 88 is high, a more stable normally-off operation becomes possible, and the shift of the threshold value is suppressed to be small.

Further, when bias electrodes 81 of respective TFTs 80 arranged on the support substrate 10 are connected with one another to be electrically common with one another, the bias electrodes 81 may be formed conveniently, and bias electrodes 81 of respective TFTs 80 can easily be controlled to have the same electric potential to suppress the variation among pixels.

Furthermore, when the bias electrode 81 has light shielding properties, it exerts a guard function to give an effect such as preventing excess charging on the back gate side, and suppressing malfunction of the TFT 80 caused by light irradiation.

Since the bias electrode 81 is fixed to have a constant electric potential independently from the gate electrode 82, power consumption is reduced. Further, since the formation of a contact hole or wiring for connecting the bias electrode 81 and the gate electrode 82 is not necessary, the active matrix substrate 1 according to the embodiment can be manufactured by a simple process at low cost.

Second Embodiment

Figure 2:
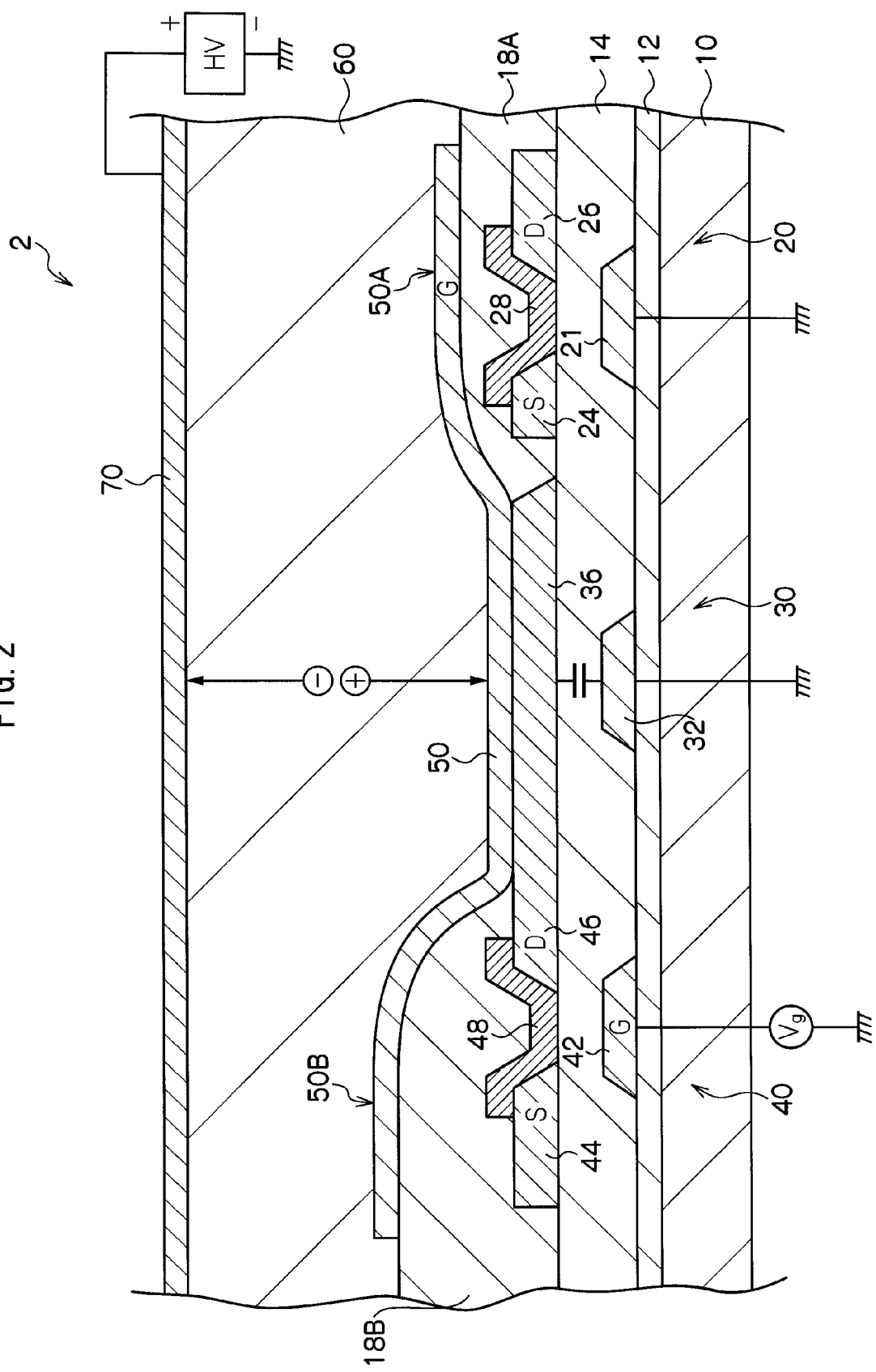
FIG. 2 is a cross-sectional view roughly showing the constitution corresponding to one pixel of the image pickup device according to a second embodiment.

FIG. 2 roughly shows one example of the constitution of an image pickup device according to a second embodiment.

The image pickup device 2 according to the embodiment has a so-called 2Tr-1C circuit structure provided with two TFTs and one capacitor in one pixel. The image pickup device 2 has a common electrode 70, a charge generating film 60 that generates charges responding to electromagnetic wave to be detected, to which film voltage is applied by the common electrode 70, a charge collecting electrode 50 that collects charges generate by the charge generating film 60, a charge detecting capacitor 30 that accumulates charges collected by the charge collecting electrode 50, a charge detecting thin film transistor (charge detecting TFT) 20 that detects the charge amount accumulated in the charge detecting capacitor 30, a resetting thin film transistor (resetting TFT) 40 that leaks charges accumulated in the charge detecting capacitor 30 to reset the charge detecting capacitor 30, and the support substrate 10.

<Common Electrode>

The common electrode 70 is connected with a high-voltage power supply (HV), and is an electrode for applying bias voltage to the charge generating film 60. The common electrode 70 may be formed of a metal such as Au or Al in a thickness of, for example, 100 nm. With respect to charges generated in the charge generating film 60 by the irradiation of electromagnetic wave, by the application of the bias voltage by the common electrode 70, electrons are attracted to the common electrode 70 side, and holes are attracted to the charge collecting electrode 50 side, respectively.

<Charge Generating Film>

The charge generating film 60 is formed of a material that generates a charge responding to electromagnetic wave that is an object to be detected. In the embodiment, the charge generating film 60 is formed of amorphous selenium (a-Se), which generates a charge when X-rays are irradiated. The charge generating film 60 constituted of a-Se can be formed by vacuum deposition at low temperatures. The thickness of the charge generating film 60 is, for example, 500 μm.

The charge generating film 60 may be selected depending on electromagnetic wave that is an object to be detected. Examples of other materials capable of forming the charge generating film 60 include CsTe, CdZnTe, $PbI_2$, $HgI_2$, SiGe, Si and the like.

<Charge Collecting Electrode>

The charge collecting electrode 50 is an electrode for collecting charges generated by the charge generating film 60 to accumulate the charge in the capacitor 30. It is electrically connected with the capacitor 30, and, further, parts 50A and 50B thereof overhang above a charge detecting TFT 20 and a resetting TFT 40, respectively, in an insulated state via second interlayer insulating films 18A and 18B. The part 50A overhanging on the charge detecting TFT 20 side also serves as a gate electrode G of the charge detecting TFT 20, and preferably overhangs up to the position that overlaps at least a part of the drain electrode 26 in the thickness direction.

After forming of second interlayer insulating films 18A and 18B, the charge collecting electrode 50 is formed, for example, by an IZO ($In_2O_3$—ZnO) film. It may be formed by patterning the IZO film by photolithography at a prescribed position and in a prescribed shape, or may be formed at a prescribed position and in a prescribed shape via a mask having holes corresponding to the charge collecting electrode 50 to be formed. The thickness of the charge collecting electrode 50 is, for example, 50 nm.

<Charge Detecting Capacitor, Charge Detecting TFT, and Resetting TFT>

The charge detecting capacitor 30 is constituted of the lower electrode 32, the first interlayer insulating film 14, and the upper electrode 36. The upper electrode 36 is electrically connected with the charge collecting electrode 50, and charges generated by the charge generating film 60 are accumulated in the capacitor 30 via the charge collecting electrode 50.

The charge detecting TFT 20 has a source electrode 24, a drain electrode 26, an active layer (channel layer) 28, and a bias electrode 21, and, further as described above, the part 50A of the charge collecting electrode 50 arranged via the second interlayer insulating film 18A serves also as the gate electrode G of the charge detecting TFT 20. By the configuration that the part 50A of the charge collecting electrode 50 serves also as the gate electrode G of the charge detecting TFT 20, the charge detecting TFT 20 of a top gate structure is built up. Further, since the charge collecting electrode 50 is electrically connected with the charge detecting TFT 20, the formation of a contact hole in the interlayer insulating films 14, 18A and 18B is not necessary. Consequently, the number of processes is decreased to achieve the reduction of manufacturing cost. Furthermore, as a material for forming interlayer insulating films 14, 18A and 18B, a material that is hardly patterned, for example, a high molecular weight insulating material having no photosensitivity, may be utilized to broaden the selection range of materials.

The bias electrode 21 of the charge detecting TFT 20 is provided at the opposite side of the active layer 28 from the gate electrode 50A, and is separated in an insulated state from the source electrode 24, the drain electrode 26, and the active layer 28 via the first interlayer insulating film 14. As the result of such constitution, the electric potential of the bias electrode 21 is fixed independently from that of the gate electrode 50A. In the embodiment, the bias electrode 21 is fixed at the earth electric potential.

On the other hand, the resetting TFT 40 has a bottom gate structure constituted of a gate electrode 42, the first interlayer insulating film 14, a source electrode 44, a drain electrode 46, and an active layer (channel layer) 48. Further, as described above, it has a so-called mushroom structure, in which the part 50B of the charge collecting electrode 50 overhangs above the resetting TFT 40 via the interlayer insulating film 18B.

Respective electrodes of the capacitor 30 and TFTs 20 and 40 can be formed all at once. For example, for the gate electrode 42, the lower electrode 32, and the bias electrode 21, a molybdenum (Mo) film is patterned on the SiON film 12 at positions and in shapes corresponding to respective electrodes (gate electrode 42, lower electrode 32 and bias electrode 21) by photolithography. Or, using a mask having holes corresponding to positions and shapes of respective electrodes, a Mo film may be formed by sputtering. The thickness of respective electrodes 42, 32 and 21 are, for example, 40 nm.

For source and drain electrodes 24, 26, 44 and 46 of respective TFTs 20 and 40 and the upper electrode 36 of the capacitor 30, the first interlayer insulating film 14 is formed using acrylic resin, gallium oxide and the like, and, after that, an IZO ($In_2O_3$—ZnO) film is formed at positions and in shapes corresponding to respective electrodes by photolithography. The thickness of respective electrodes 24, 26, 36, 44 and 46 are, for example, 200 nm.

Figure 4:
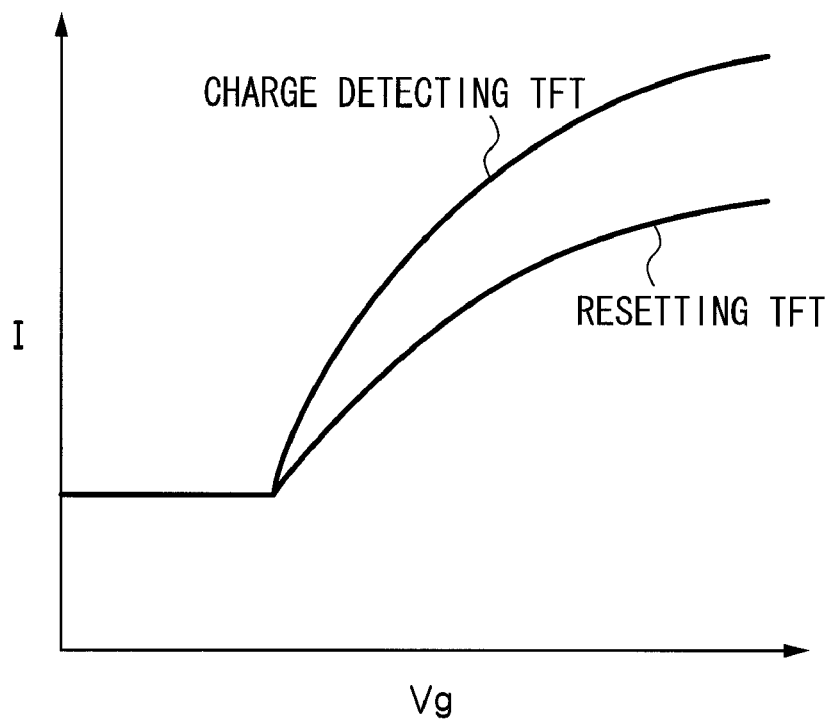
FIG. 4 is a drawing showing the relation between the I-V characteristic of a charge detecting TFT and that of a resetting TFT.

Meanwhile, respective TFTs 20 and 40 need to have characteristics corresponding to respective functions (for charge detection or for reset). When I-V characteristics of respective TFTs 20 and 40 are in the relationship, for example, as shown in FIG. 4, even when the electric potential is the same, current flows to the charge detecting TFT 20 prior to the resetting TFT 40 and the amount of charges can be detected.

For example, by employing different thicknesses or materials between second interlayer insulating films 18A and 18B provided on respective TFTs 20 and 40, TFTs 20 and 40 having characteristics corresponding to respective functions can be formed. For example, the second interlayer insulating film 18A at the charge detecting TFT 20 side is formed so as to have a smaller thickness than that of the second interlayer insulating film 18B at the resetting TFT 40 side. The thickness of the second interlayer insulating film 18A on the charge detecting TFT 20 is, for example, around the same thickness as that of the gate insulating film (first interlayer insulating film) 14 (for example, 500 nm) of the resetting TFT 40, because the part 50A of the charge collecting electrode 50 to be subsequently formed serves also as the gate electrode G of the charge detecting TFT 20. Meanwhile, when forming the second interlayer insulating film 18A with a thickness of less than 500 nm, it is preferably formed by gallium oxide.

On the other hand, in order to prevent malfunction caused by charges accumulated in the charge collecting electrode 50 formed thereon, the second interlayer insulating film 18B on the resetting TFT 40 preferably has a thickness greater than that of the second interlayer insulating film 18A on the charge detecting TFT 20, and is, for example, 3 μm.

Consequently, the distance between the charge collecting electrode 50A and source and drain electrodes 24 and 26 of the charge detecting TFT 20 becomes smaller than the distance between the charge collecting electrode 50B and source and drain electrodes 44 and 46 of the resetting TFT 40 to enable respective TFTs 20 and 40 to exert required functions.

As a method for forming second interlayer insulating films 18A and 18B having different thicknesses depending on positions as described above, a method of performing exposure using a mask, which has different light transmittance depending on positions, is favorable. For example, after coating an ultraviolet ray (UV) curable type (negative type) acrylic resin resist on the whole surface of the side on which TFT is formed, ultraviolet ray exposure is performed using a mask of a Cr film patterned so as to have UV light shielding properties at a portion corresponding to the capacitor 30, UV translucent properties at a portion corresponding to the charge detecting TFT 20, and UV permeable properties at a portion corresponding to the resetting TFT 40, respectively. Since the curing percentage of the resist varies depending on the light permeable properties of the mask, even one exposure can form second interlayer insulating films 18A and 18B having different thicknesses depending on positions.

Meanwhile, it is also possible to coat a positive type resist, perform exposure using a mask having patterns of light permeable properties that are adverse to those of a mask for use in the case of a negative type resist, and then carry out development. This case also can form second interlayer insulating films 18A and 18B having different thicknesses depending on positions.

Figure 5:
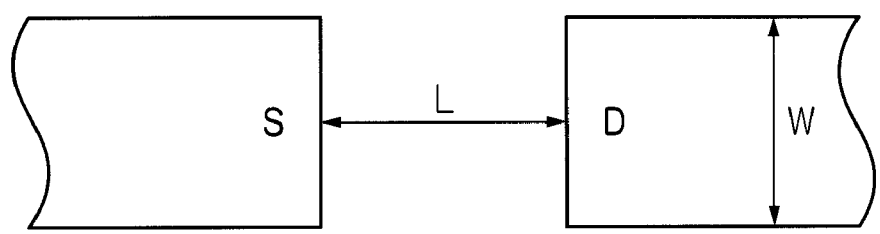
FIG. 5 is a drawing showing the interval (L) between source and drain electrodes and the width (W) thereof.
Figure 6:
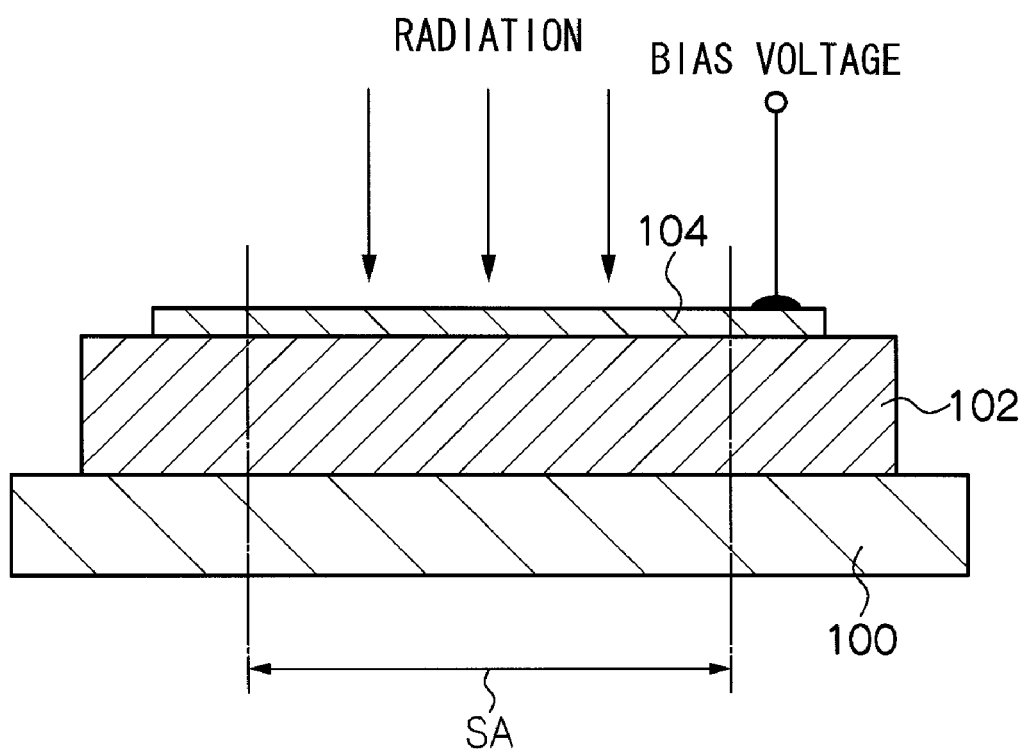
FIG. 6 is a cross-sectional view roughly showing the basic constitution of a radiation image pickup device.

Independently from the thickness or material of second interlayer insulating films 18A and 18B, the size of the source and drain electrodes of respective TFTs 20 and 40 (the width of electrodes and the distance between electrodes) may be changed in accordance with the function of respective TFTs 20 and 40. The voltage when current flows (on state) between the source and drain electrodes (through active layers 28 and 48) can be controlled by the ratio (L/W) of the distance L between the source and drain electrodes and the width W, which are shown in FIG. 5. Accordingly, by setting L/W of the source and drain electrodes of respective TFTs 20 and 40 so that characteristics of respective TFTs 20 and 40 have a relationship, for example, as shown in FIG. 4, current flows to the charge detecting TFT 20 prior to the resetting TFT 40, even if the electric potentials are the same, to thereby enable the detection of the amount of charges.

In this way, in the image pickup device 2 in which respective pixels have the above-described 2Tr-1C circuit structure, charges are generated by the charge generating film 60 responding to an electromagnetic wave such as X-ray that is an object to be detected, and, by applying bias voltage by the common electrode 70, electrons are attracted to the common electrode 70 side and holes are attracted to the charge collecting electrode 50 side. Holes collected by the charge collecting electrode 50 are accumulated in the capacitor 30 electrically connected with the charge collecting electrode 50 to raise the electric potential. The electric potential of the capacitor 30 functions as the gate electric potential of the charge detecting TFT 20, and, when it is attempted to flow current between source and drain electrodes 24 and 26, a constant current flows in accordance with the electric potential of the gate electrode 50A. Therefore, by detecting the current, it is possible to detect the electric potential of the gate electrode 50A, that is, the amount of charges. By detecting the amount of charges generated by irradiated electromagnetic wave in every pixel in this way and outputting the amount as electric signals, a whole image of the object can be obtained.

In particular, in the case of a direct conversion type X-ray image pickup device, charges generated by X-rays are apt to electrify the back-channel side to easily vary the threshold value. However, in the image pickup device 2 of the embodiment, by fixing the bias electrodes 21 of the charge detecting TFTs 20 for respective pixels at the earth electric potential, the normally-off operation is more easily attained, and the shift of the threshold value is more surly suppressed. Further, when bias electrodes 21 of the charge detecting TFTs 20 for respective pixels are connected with one another to be electrically common with one another among all the pixels, the bias electrodes 21 of the charge detecting TFTs for respective pixels can easily and surely be controlled to have the same electric potential to suppress variation among the pixels.

After taking an image, since the capacitor 30 is in a state in which charges are accumulated, in order to take a next image, it is necessary to leak charges in the capacitor 30 to be reset. On this occasion, by putting the gate electrode 42 of the resetting TFT 40 into on state, the electric potential of the capacitor 30 can be reset to the original electric potential before taking the image.

In the image pickup device 2 of the embodiment, the bias electrode 21 is fixed at a constant electric potential, and, therefore, a stable normally-off operation is attained with small power consumption and the shift of the threshold value is suppressed to enable stable detection of X-ray charges. Further, the overhanging portions 50A and 50B of the charge collecting electrode 50 suppress malfunctions caused by charges near the interface (back-channel side) of the active layer of the TFT, thereby enabling a high speed and highly sensitive imaging. Meanwhile, when excessive charges accumulate in the capacitor 30 and the charge collecting electrode 50, the overhanging portion 50B of the charge collecting electrode 50 exerts functions similar to those of a gate electrode, and the source and drain electrodes 44 and 46 of the resetting TFT 40 become spontaneously on state to leak charges to give the effect of preventing discharge breakdown.

Further, since the charge collecting electrode 50 is electrically connected with the gate electrode G of the charge detecting TFT 20 without forming a contact hole in interlayer insulating films 14, 18A and 18B, manufacturing with a simple process at low cost is possible.

Third Embodiment

Figure 3:
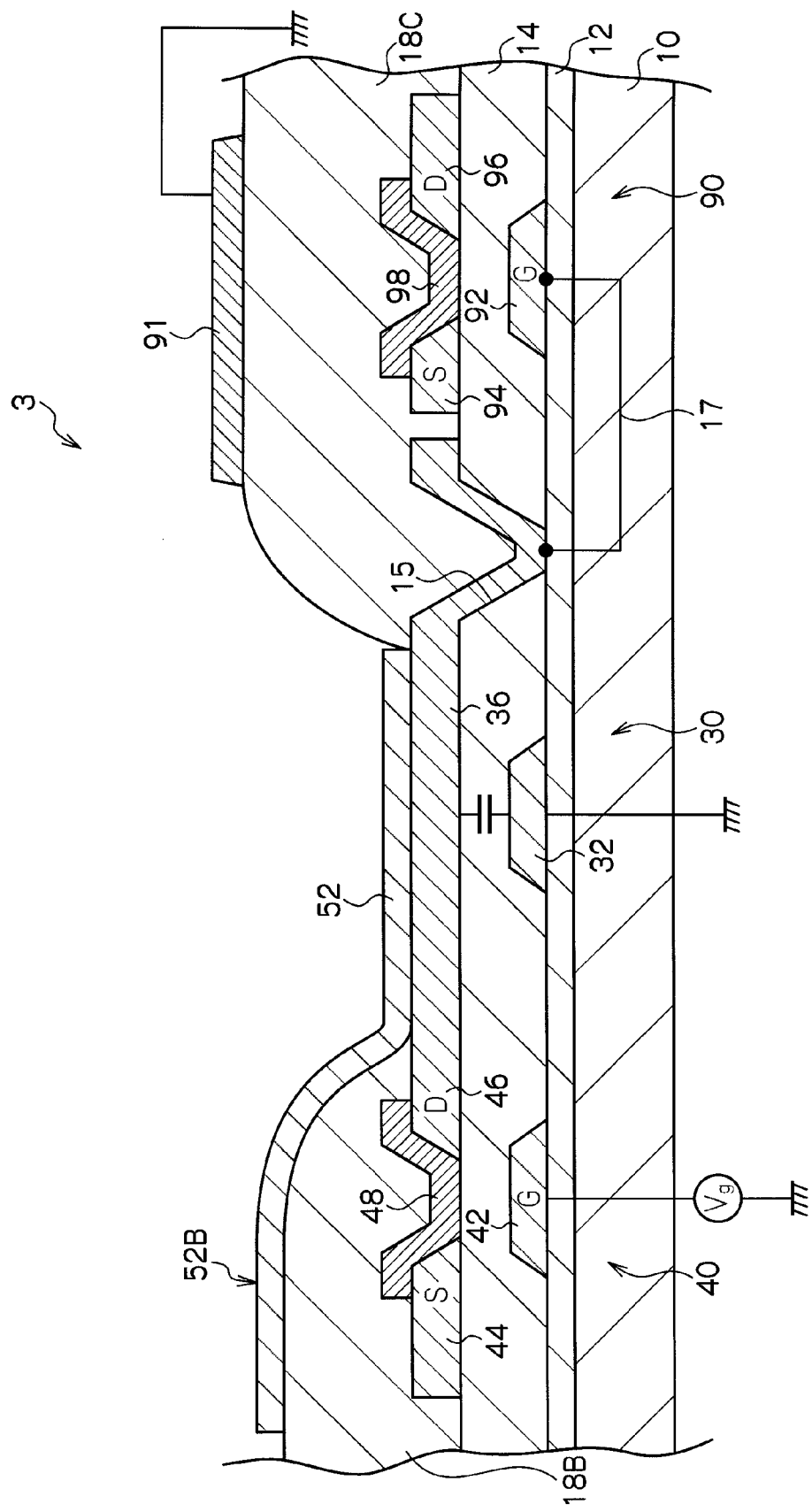
FIG. 3 is a cross-sectional view roughly showing the constitution corresponding to one pixel of the image pickup device according to a third embodiment.

FIG. 3 roughly shows one example of the constitution of an image pickup device according to a third embodiment provided with a thin film transistor (TFT). The common electrode and charge generating film are omitted (not shown) in FIG. 3.

An image pickup device 3 according to the embodiment is also provided with a charge collecting electrode 52, a charge detecting capacitor 30, a resetting TFT 40, and a charge detecting TFT 90.

The charge collecting electrode 52 is electrically connected with the upper electrode 36 of the capacitor 30, and a part 52B of the charge collecting electrode 52 overhangs above the resetting TFT 40 via the second interlayer insulating film 18B.

The constitution of the resetting TFT 40 is the same as that of the second embodiment.

Further, the upper electrode 36 of the charge detecting capacitor 30 is electrically connected with the drain electrode 46 of the resetting TFT 40, and, at the same time, passes thorough the first interlayer insulating film 14 via the contact hole 15. Meanwhile, in the embodiment, since the contact hole 15 is formed in the first interlayer insulating film 14, the first interlayer insulating film 14 is preferably formed with gallium oxide.

The charge detecting TFT 90 has a bottom gate structure having a gate electrode 92, a source electrode 94, a drain electrode 96, and an active layer (channel layer) 98, and, further, a bias electrode 91 is arranged via the second interlayer insulating film 18C. The bias electrode 91 is fixed at the earth electric potential. The gate electrode 92 is electrically connected with the upper electrode 36 of the capacitor 30 through wiring 17.

A method for taking images by the image pickup device 3 of the embodiment is basically the same as that of the image pickup device 2 of the second embodiment. That is, charges generated by a charge generating film (not shown) by irradiating an electromagnetic wave that is the object to be detected are collected in the charge collecting electrode 52, and, after that, the charges are accumulated in the capacitor 30 to raise the electric potential. The electric potential of the capacitor 30 is converted to the gate electric potential of the charge detecting TFT 90 through the wiring 17, and, when it is attempted to flow current between source and drain electrodes 94 and 96, a constant current in accordance with the electric potential of the gate electrode 92 flows. Therefore, by detecting the current, it is possible to detect the electric potential of the gate electrode 92, that is, the amount of charges. As described above, by detecting the amount of charges generated by irradiated electromagnetic wave in every pixel and outputting it as electric signals, the whole image of the object can be obtained.

Also in the image pickup device 3 of the embodiment, by fixing the bias electrode 91 of the charge detecting TFT 90 in respective pixels at the earth electric potential, the normally-off operation is more easily attained, and the shift of the threshold value can more surely be suppressed.

Further, by connecting bias electrodes 91 of charge detecting TFTs 90 in respective pixels to make the electric potentials of bias electrodes 91 common with one another among all the pixels, the formation of the bias electrode 91 is easy, and bias electrodes 91 of charge detecting TFTs in respective pixels can easily controlled to have the same electric potential to suppress the variation among pixels.

Further, the part 52B of the charge collecting electrode 52 covers the resetting TFT 40 via the second interlayer insulating film 18B and the bias electrode 91 covers the charge detecting TFT 90 via the second interlayer insulating film 18C to exert guard function against charges generated in the charge generating film 60 and to prevent malfunction caused by the electrification near the interface of active layers 48 and 98 of respective TFTs 40 and 90. Furthermore, also in the embodiment, when excess charges accumulate in the capacitor 30 and the charge collecting electrode 52, the overhanging part 52B of the charge collecting electrode 52 exerts a function similar to that of a gate electrode, so that source and drain electrodes 44 and 46 of the resetting TFT 40 become spontaneously on state to leak charges to prevent discharge breakdown. Accordingly, the image pickup device 3 of the embodiment can also attain high-speed and highly sensitive imaging.

Meanwhile, in the embodiment, in order that the second interlayer insulating film 18C has a small thickness to enhance the sensitivity (controllability) of the bias electrode 91, the second interlayer insulating film 18C is preferably formed with gallium oxide film.

After the imaging, by putting the gate electrode 42 of the resetting TFT 40 into on state, the electric potential of the capacitor 30 is reset to the original electric potential before the imaging.

As described above, also in the image pickup device 3 according to the embodiment, the bias electrode 91 in the charge detecting TFT 90 is fixed at an electric potential independent from that of the gate electrode 92. Therefore, it attains a small amount of power consumption and a stable normally-off operation, and can suppress the shift of the threshold value to perform stable imaging.

Further, also in the image pickup device 3 of the embodiment, since the formation of a contact hole or wiring for connecting the bias electrode 91 with the gate electrode 92 is not necessary, the manufacturing with a simple process at low cost is possible.

According to the invention, for example, the following exemplary embodiments <1> to <10> are provided.

<1> A thin film transistor comprising:
source and drain electrodes,
an active layer that contacts the source and drain electrodes and contains an oxide semiconductor,
a gate electrode that controls current flowing between the source and drain electrodes via the active layer,
a first insulating film that separates the gate electrode from the source and drain electrodes and the active layer,
a bias electrode that is arranged at the opposite side of the active layer from the gate electrode, and has an electric potential fixed independently from the gate electrode, and
a second insulating film that separates the bias electrode from the source and drain electrodes and the active layer.

<2> The thin film transistor according to <1>, wherein the second insulating film is a gallium oxide film.

<3> The thin film transistor according to <1> or <2>, wherein the carrier concentration in the active layer is $3 \times 10^{17}$ cm$^{-3}$ or more.

<4> The thin film transistor according to any one of <1> to <3>, wherein the electric potential of the bias electrode is fixed within the range of −2 to +0.5 V.

<5> An active matrix substrate comprising thin film transistors as described in any one of <1> to <4> arranged on a support substrate.

<6> The active matrix substrate according to <5>, wherein the bias electrodes of the thin film transistors arranged on the support substrate are connected with one another to be electrically common with one another.

<7> An image pickup device comprising:
a common electrode,
a charge generating film that generates a charge responding to an electromagnetic wave that is an object to be detected, to which charge generating film voltage is applied by the common electrode,
a charge collecting electrode that collects the charge generated by the charge generating film,
a charge detecting capacitor that accumulates the charge collected by the charge collecting electrode,
a charge detecting thin film transistor that detects the amount of the charge accumulated in the charge detecting capacitor,
a resetting thin film transistor that leaks the charge accumulated in the charge detecting capacitor to reset the charge detecting capacitor, and
a support substrate supporting the charge generating film, the charge collecting electrode, the charge detecting capacitor, the charge detecting thin film transistor, and the resetting thin film transistor,
wherein the thin film transistor as described in any one of <1> to <4> is provided as the charge detecting thin film transistor.

<8> The image pickup device according to <7>, wherein a part of the charge collecting electrode overhangs above the charge detecting thin film transistor in an insulated state, and serves also as the gate electrode of the charge detecting thin film transistor.

<9> The image pickup device according to <7> or <8>, wherein a part of the charge collecting electrode overhangs above the resetting thin film transistor in an insulated state.

<10> The image pickup device according to any one of <7> to <9>, wherein the charge generating film generates a charge responding to X-rays.

According to the invention, a thin film transistor, an active matrix substrate, and an image pickup device, which are manufactured easily, suppress the variation of the threshold value, attain the stable normally-off operation, and, in addition, can suppress the power consumption to be small, are provided.

EXAMPLES

Hereinafter, Examples and Comparative Examples are described.

Example 1

An X-ray sensor provided with a bias electrode as shown in FIG. 3 was manufactured by the processes described below.

—Formation of Gate Electrode and Lower Electrode of Capacitor—

After forming a Mo film (thickness: 40 nm) on a glass substrate by sputtering, it was patterned by photolithography and wet etching to form a gate electrode and a lower electrode of a capacitor.

—Formation of First Insulating Film (Gate Insulating Film)—

Next, a SiO$_2$ film (thickness: 200 nm) was formed by sputtering to form a gate insulating film (first insulating film) and a dielectric layer of the capacitor.

—Formation of Source and Drain Electrodes and Upper Electrode of Capacitor—

After forming an IZO film (thickness: 200 nm) by sputtering without introducing oxygen, it was patterned by photolithography and wet etching to form source and drain electrodes and an upper electrode of the capacitor. At the edge of source and drain electrodes, a taper angle (tilt angle) of 25° was formed.

—Formation of Active Layer—

After forming an IGZO film (thickness: 50 nm) by sputtering, it was patterned by photolithography and wet etching to form an active layer between the source and drain electrodes.

—Formation of Second Insulating Film—

As a second insulating film, an amorphous Ga$_2$O$_3$ film (thickness: 200 nm) was formed by sputtering on the active layer side of the substrate. Next, on the Ga$_2$O$_3$ film, a resist (trade name: AZ5214-E, manufactured by AZ Electronic Materials) was coated, which was subjected to pattern exposure so that an approximately whole surface of the upper electrode of the capacitor was exposed after development. After the exposure, a developer (trade name: AZ300MIF DEVELOPER, manufactured by AZ Electronic Materials) was used to develop the photoresist and to etch the exposed portions of the Ga$_2$O$_3$ film.

After the development and etching, the photoresist was removed with a neutral removing liquid (trade name: REMOVING LIQUID 104, manufactured by Tokyo Ohka Kogyo) to expose the Ga$_2$O$_3$ film remaining under the photoresist.

—Formation of Bias Electrode and Charge Collecting Electrode—

Next, after forming a Mo film (thickness: 100 nm) by sputtering, a resist (trade name: AZ5214-E, manufactured by AZ Electronic Materials) was coated on the Mo film, which were, next, patterned by photolithography and wet etching. Here, as the etching solution, a mixed solution of phosphoric acid and nitric acid was used.

This lead to the formation of a bias electrode 91 above an active layer 98 of the charge detecting TFT 90 via the Ga$_2$O$_3$ film 18C, and to the formation of a charge collecting electrode 52 that was connected to the upper electrode 36 of the capacitor 30 and had the part 52B overhanging above the resetting TFT 40 as shown in FIG. 3.

—Formation of Charge Generating Film—

As a charge generating film, amorphous selenium was deposited by resistive heating in a thickness of 500 μm to form an X-ray photoconductor layer.

—Formation of Common Electrode—

As a common electrode, Au was deposited by resistive heating in a thickness of 0.1 μm.

Through the processes as described above, an X-ray sensor was manufactured. To the X-ray sensor, X-rays were irradiated while applying a positive bias (+5 kV) to the common electrode, −5 V to the gate electrode of the resetting TFT, and 0 V (common) to the resetting source electrode, and, after that, the X-ray signal current flowing through between the source and drain electrodes of the charge detecting transistor was detected. After that, by applying +10 V to the gate electrode of the resetting TFT, the charge detecting capacitor was reset.

Example 2

An X-ray sensor was manufactured in a manner substantially similar to that in Example 1, except for forming a second insulating film in a manner described below.

After forming the active layer, an acrylic resin (trade name: JEM-531, manufactured by JSR) was spin-coated, which was subjected to pattern exposure so that an approximately whole surface of the upper electrode of the capacitor was exposed after development. After the exposure, the acrylic resin film was developed with a developer (trade name: AZ300MIF DEVELOPER, manufactured by AZ Electronic Materials). As a result, an acrylic resin film having a thickness of 500 nm was formed as the second insulating film.

Next, in the same manner as that in Example 1, the charge collecting electrode and the bias electrode were formed, and, after that, the charge generating film and the common electrode were formed sequentially.

To the X-ray sensor manufactured as described above, X-rays were irradiated while applying a positive bias (+5 kv) to the common electrode, −5 V to the gate electrode of the resetting TFT, and 0 V (common) to the resetting source electrode, and, after that, the X-ray signal current flowing through between the source and drain electrodes of the charge detecting transistor was detected. After that, by applying +10 V to the gate electrode of the resetting TFT, the charge accumulation capacitor was reset.

Comparison Between Example 1 and Example 2

After storing the sensors of Example 1 and Example 2 under a high humidity environment of 90% for 1W (one week), the experiment of X-ray signal detection was performed again. As a result, in the sensor of Example 2, an error such that the signal values detected by the pixels in the periphery regions increased apparently was occurred. The error was eliminated by applying an electric potential of −1 V to the bias electrode. This error is thought to be caused because the threshold value of the IGZO-TFT was shifted to the negative value in the regions where $H_2O$ had permeated the acrylic resin interlayer insulating film. In point of having higher robustness against the environment, Example 1 is preferable.

Comparative Example 1

In a manner similar to that in Example 1, there were formed from the gate electrode to the active layer on a glass substrate.

Next, as an interlayer insulating film, a $SiO_2$ film (thickness: 200 nm) was formed by sputtering on the active layer side of the substrate.

On the $SiO_2$ film, a resist (trade name: AZ5214-E, manufactured by AZ Electronic Materials) was coated, which was subjected to a pattern exposure so that an approximately whole surface of the upper electrode of the capacitor was exposed after development. After the exposure, the photoresist was developed with a developer (trade name: AZ300MIF DEVELOPER, manufactured by AZ Electronic Materials).

After the development, the $SiO_2$ film was etched via the photoresist. As a means for the etching, a wet etching method by hydrofluoric acid having strong toxicity was avoided and dry etching was performed. Next, by removing the photoresist with a removing liquid (trade name: REMOVING LIQUID 104, manufactured by Tokyo Ohka Kogyo) to expose the $SiO_2$ film remaining under the photoresist.

Next, in the same manner as that in Example 1, the bias electrode, the charge collecting electrode, the charge generating film, and the common electrode were formed sequentially.

To the X-ray sensor manufactured as described above, X-rays were irradiated while applying a positive bias (+5 kV) to the common electrode, −5 V to the gate electrode of the resetting TFT, and 0 V (common) to the resetting source electrode. After that, although the current that flew through between the source and drain electrodes of the charge detecting transistor was checked, a current responding to the X-rays could not be detected. This is thought to be because the OFF-current of the IGZO-TFT was increased due to the process of forming the $SiO_2$ film and the dry etching process, so that the sensor could not operate normally.

Example 3

In the constitution as shown in FIG. 1, in a manner similar to that in Example 1, there were formed from the gate electrode to the $Ga_2O_3$ film on a glass substrate. After patterning the $Ga_2O_3$ film by photolithography and an alkaline developer (trade name: AZ5214-E, manufactured by AZ Electronic Materials), the bias electrode 81 was formed in a manner similar to that in Example 1. This gave a TFT substrate for liquid crystal.

On the other hand, electrodes (ITO, thickness: 50 nm) were formed on another glass substrate to produce a counter electrode substrate.

Liquid crystal was filled between the TFT electrode and the counter electrode, and the space between both the substrates was sealed to produce a liquid crystal display.

When respective electrodes of the liquid crystal display produced as described above were connected with an external power source, and the liquid crystal display was driven, an image could be displayed.

Example 4

A liquid crystal display was produced in a manner substantially similar to that in Example 3, except for forming the second insulating film as follows.

After forming the active layer, an acrylic resin (trade name: JEM-531, manufactured by JSR) was spin-coated, which was subjected to a pattern exposure so that an approximately whole surface of the upper electrode of the capacitor was exposed after development. After the exposure, the acrylic resin film was developed with a developer (trade name: AZ300MIF DEVELOPER, manufactured by AZ Electronic Materials). As a result, an acrylic resin film having a thickness of 1000 nm was formed as the second insulating film.

After forming the second insulating film as described above, a liquid crystal display was produced in the same manner as that in Example 3. When respective electrodes of the display was connected with an external power source and the display was driven, an image could be displayed.

For both Examples 3 and 4, as the result of applying the earth electric potential to the bias electrode, it was possible to improve the threshold voltage from −2 V to −1 V.

After the storage under a high humidity condition (90%, 1W), the device in Example 3 showed less image unevenness as compared with the device in Example 4.

Hereinbefore, the invention has been described, but the invention in not limited to the embodiments and Examples. For example, the charge collecting electrode does not necessarily overhang above the resetting TFT.

Further, the source and drain electrodes and the active layer of respective TFTs may be formed in an inverse order. That is, source and drain electrodes may be formed after forming the active layer.

Furthermore, no limitation is imposed on the number of TFTs in one pixel. The invention may be applied to an image pickup device having three or more TFTs in one pixel.

The invention may also be applied to displays having TFTs in respective pixels such as liquid crystal displays and organic EL displays, in addition to indirect image pickup devices and devices that take an image by detecting ultraviolet rays, visible light or the like.

Figure 7:
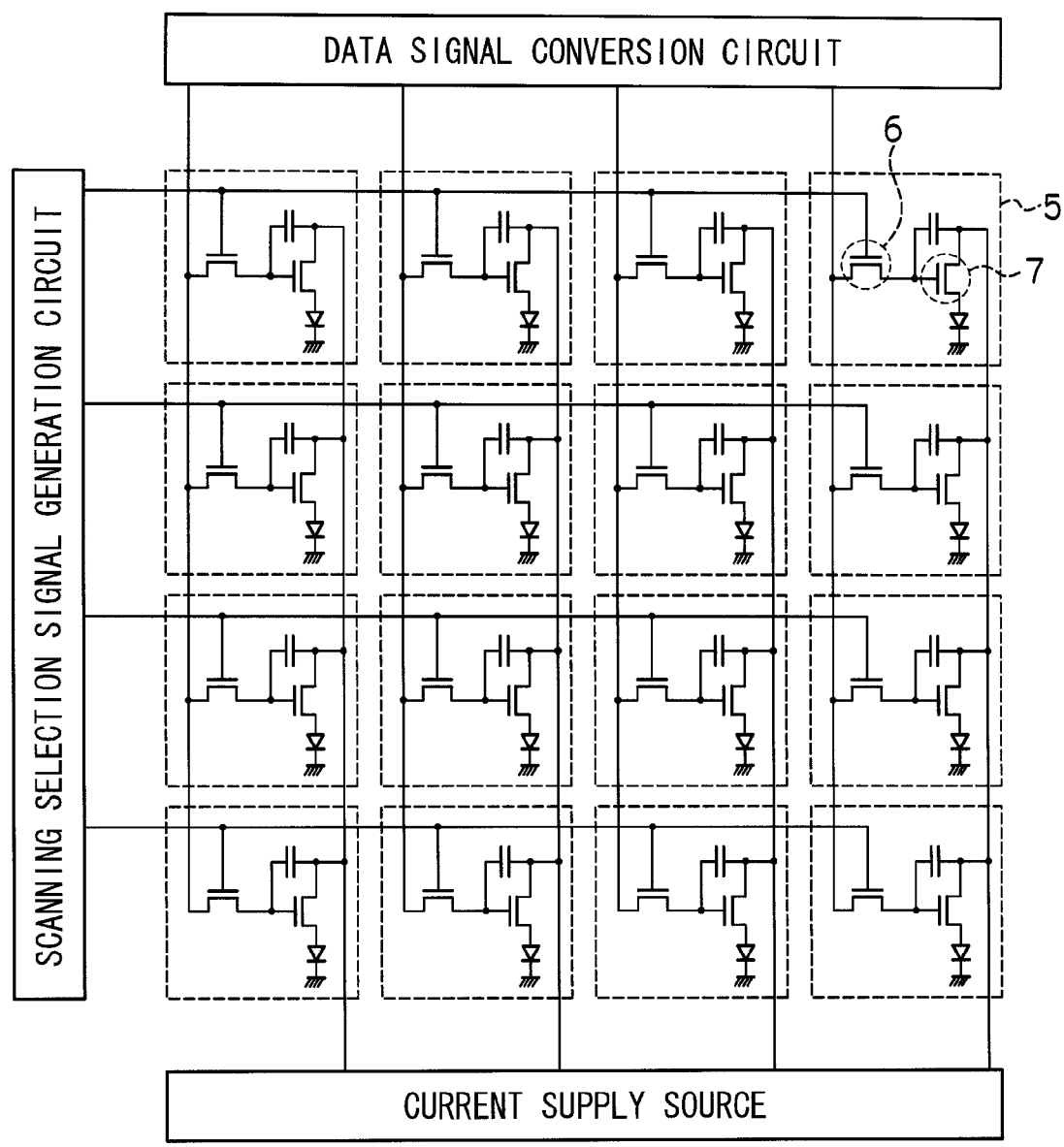
FIG. 7 is a drawing showing one example of a circuit configuration of the active matrix substrate.

For example, in an active matrix substrate or display in which multiple pixels 5 are arranged on a support substrate and respective pixels are driven by a 2Tr-1C structure as shown in FIG. 7, by applying the TFT of the invention as at least one of two TFTs 6 and 7 in respective pixels 5, the advantage of the invention can be obtained.

All publications, patent applications, and technical standards mentioned in this specification are herein incorporated by reference to the same extent as if each individual publication, patent application, or technical standard was specifically and individually indicated to be incorporated by reference.

What is claimed is:

1. An active matrix substrate comprising:
   a plurality of thin film transistors, each thin film transistor comprising:
   source and drain electrodes,
   an active layer that contacts the source and drain electrodes and contains an oxide semiconductor, a gate electrode that controls current flowing between the source and drain electrodes via the active layer,
   a first insulating film that separates the gate electrode from the source and drain electrodes and the active layer,
   a bias electrode that is arranged at the opposite side of the active layer from the gate electrode, and has an electric potential fixed independently from the gate electrode, and
   a second insulating film that separates the bias electrode from the source and drain electrodes and the active layer, wherein
   the plurality of thin film transistors are arranged on a support, and
   all the bias electrodes are interconnected such that they are all electrically common with one another.

2. The active matrix substrate of claim 1, wherein the second insulating film is a gallium oxide film.

3. The active matrix substrate of claim 1, wherein the carrier concentration in the active layer is $3\times10^{17}$ cm$^{-3}$ or more.

4. The active matrix substrate of claim 1, wherein the electric potential of the bias electrode is fixed within the range of −2 to +0.5 V.

5. The active matrix substrate of claim 1, wherein the bias electrode has light shielding properties.

* * * * *